United States Patent
Jiang et al.

(10) Patent No.: US 7,793,196 B2
(45) Date of Patent: Sep. 7, 2010

(54) METHODS AND APPARATUS FOR IMPROVED ERROR AND ERASURE CORRECTION IN A REED-SOLOMON DATE CHANNEL

(75) Inventors: Dongyan Jiang, Windsor, CO (US); Alan D. Poeppelman, Fort Collins, CO (US); Timothy D. Thompson, Windsor, CO (US)

(73) Assignee: LSI Corporation, Milpitas, CA (US)

( * ) Notice: Subject to any disclaimer, the term of this patent is extended or adjusted under 35 U.S.C. 154(b) by 1052 days.

(21) Appl. No.: 11/507,156

(22) Filed: Aug. 21, 2006

(65) Prior Publication Data
US 2008/0065966 A1    Mar. 13, 2008

(51) Int. Cl.
*H03M 13/00* (2006.01)

(52) U.S. Cl. .................. 714/784; 714/756; 714/786

(58) Field of Classification Search ............... 714/784, 714/753, 756, 786, 780
See application file for complete search history.

(56) References Cited

U.S. PATENT DOCUMENTS

| | | | | |
|---|---|---|---|---|
| 4,597,083 A | * | 6/1986 | Stenerson | .......... 714/753 |
| 5,392,299 A | * | 2/1995 | Rhines et al. | .......... 714/756 |
| 5,535,225 A | * | 7/1996 | Mayhew et al. | .......... 714/785 |
| 5,875,199 A | * | 2/1999 | Luthi | .......... 714/780 |

OTHER PUBLICATIONS

Sawarte, D. et al.; *High-Speed Architectures for Reed=Solomon Decoders*; IEEE Transactions on VLSI Systems, vol. 9, No. 5; Oct. 2001.

* cited by examiner

*Primary Examiner*—Fritz Alphonse
(74) *Attorney, Agent, or Firm*—Duft Bornsen & Fishman LLP

(57) ABSTRACT

Methods and associated structures for improved erasure correction and detection in digital communication channels utilizing modified Reed-Solomon decoding of encoded digital data. Methods and associated apparatus in accordance with features and aspects hereof perform Galois Field element generation in descending order for Reed-Solomon erasure detection and correction. Real time computation of Galois Field elements in descending order as required for erasure detection and correction features and aspects hereof eliminates the need for costly, complex, large, high speed lookup tables as previously practiced in the art for storing Galois Field element values pre-computed in the same ascending order of reception of the encoded code words. Features and aspects hereof may thus be applied in digital read channel applications including, for example, digital telecommunications receive/read channels and digital data storage read channels.

19 Claims, 4 Drawing Sheets

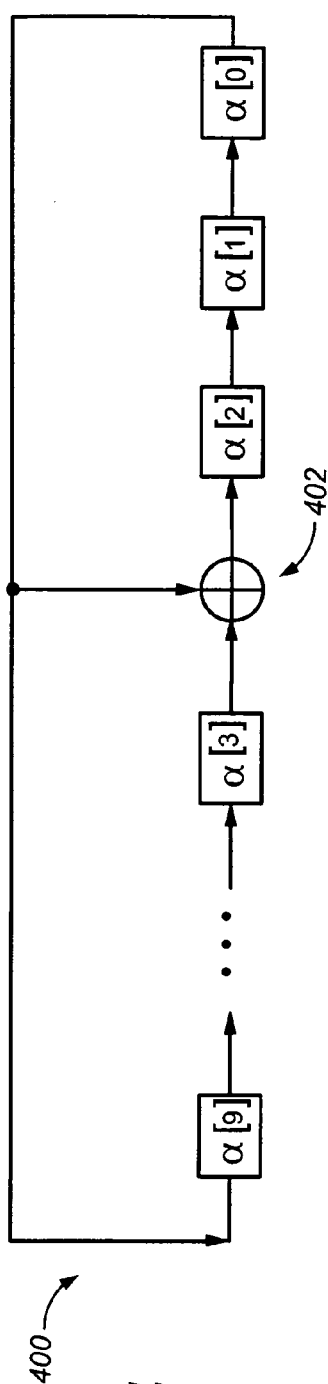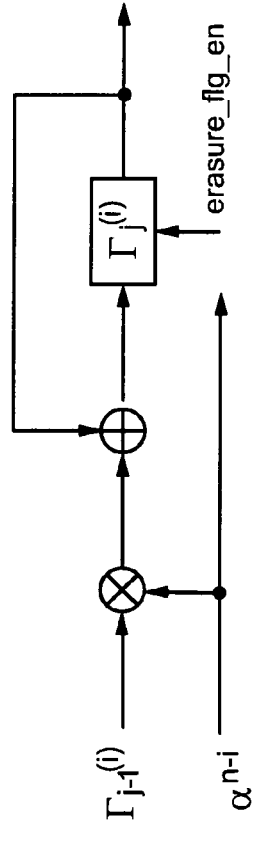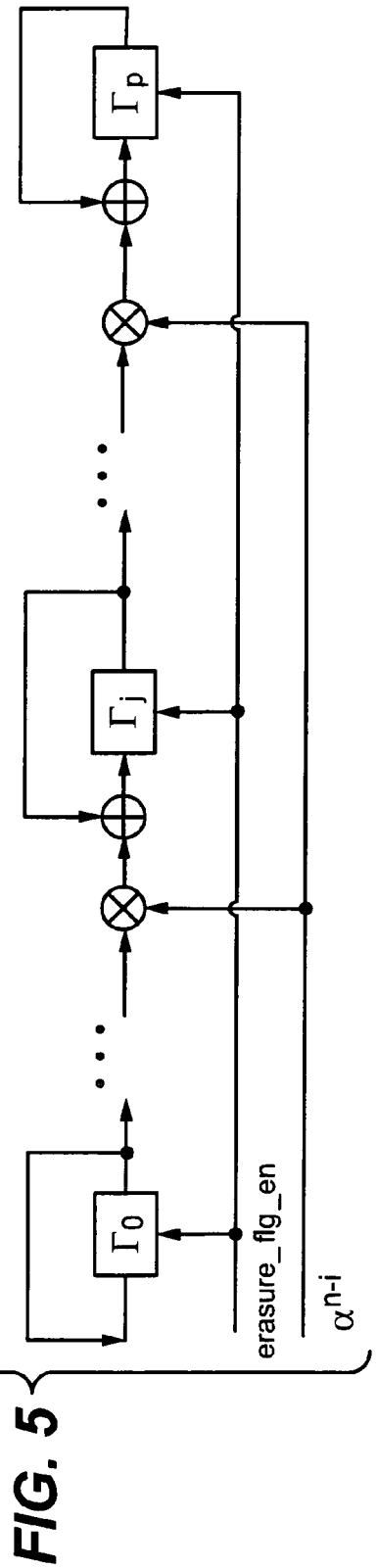
FIG. 4
FIG. 5

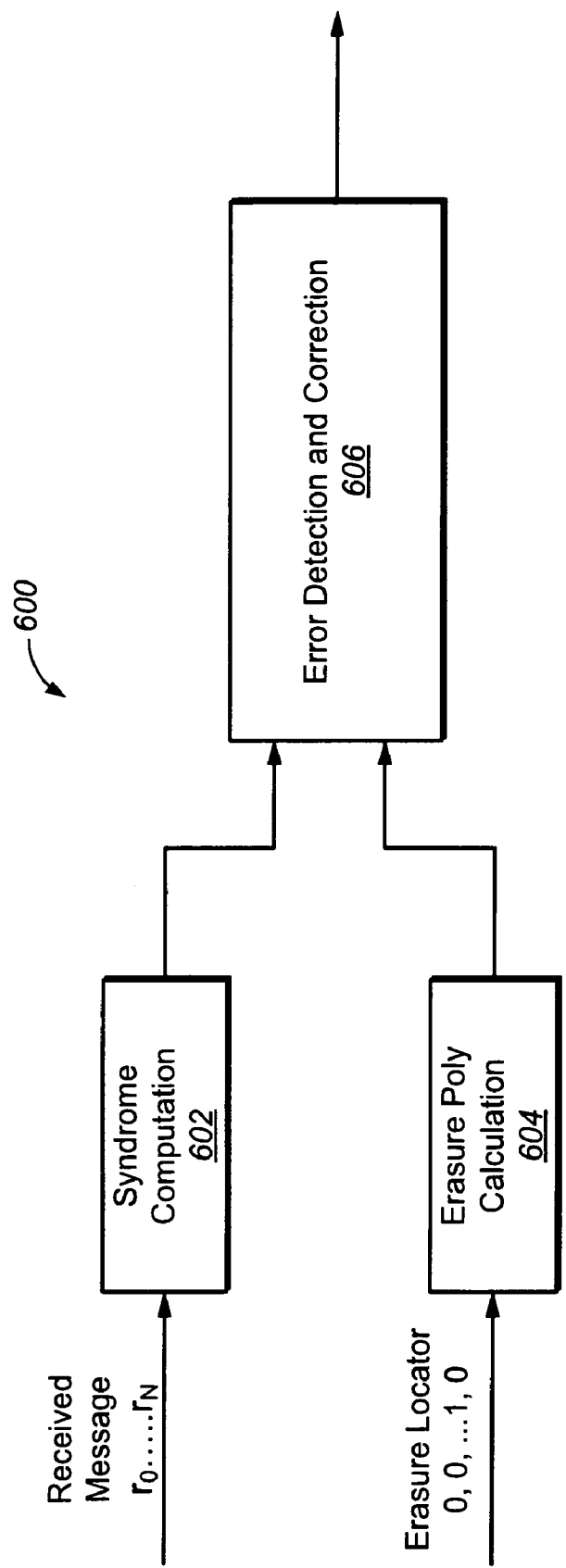

METHODS AND APPARATUS FOR IMPROVED ERROR AND ERASURE CORRECTION IN A REED-SOLOMON DATE CHANNEL

BACKGROUND OF THE INVENTION

1. Field of the Invention

The invention relates generally to error processing in a digital data channel and more specifically relates to improved methods and structures for real time computation of an erasure polynomial to detect and correct data errors from erasure conditions in a digital data channel using Reed-Solomon encoding/decoding.

2. Discussion of Related Art

In digital communication systems it is generally known to transmit or store digital data encoded in forms that improve reliability in reading stored data or receiving transmitted data. Noise on the digital communication channel or other symbol interference generated within the channel or induced in the channel by external signals may cause un-encoded information to be frequently erroneously transmitted or read. Transforming the digital data into encoded sequences based on mathematical spreading of the encoded symbols and generating corresponding error correction and detection codes ("ECC"), such a digital channel may be used in a manner far more immune to noise and interference.

As used herein, "communication" channel includes any receiving components of a digitally encoded channel. For example, a receiver in a digital communication system or a read head in a data storage system are both examples of communication channels that may encounter problems discussed herein and may beneficially apply the features and aspects hereof. Thus "communication channel" and "read channel" may be understood as synonymous in the context of this application.

Exemplary of such digital channels are digital communication channels such as computer or telecommunications network communication media as well as data storage systems wherein data is transmitted to the storage device for storage on a recordable medium as encoded code words and read back from the recordable medium. In communication digital channels, noise and interference may be caused by the analog modulation of the encoded signals and associated analog noise in the ambient environment in which the transmission is performed. In storage applications, the digital channel modulates encoded digital information and associated error correction information onto the associated recordable medium as magnetic flux changes and/or optical property changes on the recordable media. Reading the previously recorded information back, the digital read channel must cope with inter-symbol interference and other aspects of the analog recording of the encoded digital information associated with the magnetic and/or optical storage medium.

It is generally known in the art to utilize Reed-Solomon encoding techniques for high-speed digital communication channels and high-density digital data storage applications. In general, Reed-Solomon encoding techniques encode and embed error correction information along with each encoded unit of transmitted or stored information. Thus, Reed-Solomon encoding as applied in digital communication channels (e.g., telecommunications and/or data storage applications) provides a compact encoding of information including highly effective error correction. Sequences of encoded code words are expected and/or precluded in accordance with the encoding techniques of Reed-Solomon. Thus, as each code word is decoded errors may be detected from the error correction information associated with each code word based on the likelihood of particular code words being encountered in particular sequences.

In addition to correction of erroneous digital data received or retrieved by using Reed-Solomon encoding, other modifications to known Reed-Solomon techniques have been employed to further enhance detecting and correcting erasures of previously stored data. In general, modified Reed-Solomon techniques may also detect and correct erasures of encoded data as distinct from merely erroneous transmission or retrieval of previously encoded information.

As well known to those of ordinary skill in the art, modified Reed-Solomon techniques used to correct both errors and erasures are based upon a discrete time based polynomial expression derived from application of Galois Fields. As used for erasure detection and correction, the Galois Field generator for typical 10-bit code words may be expressed as a discrete time polynomial as follows:

$$m(x)=x^{10}+x^3+1$$

Those of ordinary skill in the art will recognize many other discrete time polynomials that may be utilized for generation of Galois Field values. Thus the above polynomial is intended merely as exemplary of one such discrete time polynomial useful for Galois Field value generation.

A typical Galois Field generator circuit may be implemented as a shift register structure coupled with a summing component as generally known in the field. Exemplary of a known shift register structure in accordance with the above discrete time equation, the Galois Field generator $GF(2^{10})$ may be implemented as a left shift register and summing junction well known to those of ordinary skill in the art. Such a typical Galois Field generator computes the Galois Field ("GF") element values on each clock cycle in ascending order since each subsequent GF element depends on the previous element. However, as applied to erasure correction as distinct from error correction using Reed-Solomon encoding, the Galois Field elements are utilized in reverse order—e.g., in descending order relative to the ascending order of the received/retrieved code words.

As presently practiced it is impractical to compute each Galois Field element for erasure detection and correction in real time as it is required in the Reed-Solomon decoding process since utilization of the elements in descending order requires re-computation of each earlier element. Such duplicative re-computation of Galois Field elements renders the computational process too slow for real time generation of the Galois Field elements in high speed communication application or high density storage applications. Thus, as presently practiced, the Galois Field elements are generated in ascending order and saved in a lookup table comprised of high speed memory (e.g., a register file or high speed memory circuits) to assure rapid access to the pre-computed GF element values.

It is a problem in such applications that the lookup table used to store pre-computed Galois Field elements may be large. Since the utilized memory structures must be high speed (e.g., a register array) the lookup table circuits may consume substantial circuitry and associated power within the application circuit design for the digital communication channel. For example, a typical GF generator such as $GF(2^{10})$ may require storage of up to 1023 10-bit GF element values. As recording density or transmission speeds increase in the digital communication channel, even larger lookup table structures may be required. Such substantial storage requirements for high speed memory components such as register files represent significant complexity and cost in design of the digital communication channel circuits.

It is evident from the above discussion that a need exists for an improved communication channel design useful in Reed-Solomon erasure detection and correction applications to permit real time error and erasure detection and correction while minimizing circuit complexity and cost area.

SUMMARY OF THE INVENTION

The present invention solves the above and other problems, thereby advancing the state of the useful arts, by providing apparatus and methods for processing error detection and correction information to detect and correct both errors and erasures in real-time as Reed-Solomon encoded data is received in a digital communication channel. Features and aspects hereof generate Galois Field elements in descending order for use in detecting and correcting erasures in the received, Reed-Solomon encoded information. The real time descending Galois Field generation obviates the need for lookup tables and associated complex, costly, high speed memory circuits in a Reed-Solomon decoder as presently practiced in the art.

In one aspect, a method is provided for processing received data in a digital communication channel. The method includes receiving a sequence of code words representing encoded digital data. The method then provides for decoding the encoded digital data to generate decoded digital data to be utilized in further data processing. The step of decoding further includes correcting erasures in the sequence of code words by applying a discrete time polynomial thereto such that the discrete time polynomial utilizes Galois Field elements determined from the sequence code words, and generating the Galois Field elements in real time substantially concurrently with reception of the sequence of code words such that the Galois Field elements are generated in descending order relative to the order of reception of the sequence of code words.

In another aspect, a communication channel is provided including a receiver for receiving a sequence of words representing encoded digital data. The channel also includes a decoder coupled to receive a sequence of code words representing encoded digital data. The decoder is adapted to generate corresponding decoded digital data and further includes an erasure correction element adapted to detect and correct erasures in the received sequence of code words by applying a discrete time polynomial to the sequence of code words such that the discrete time polynomial utilizes Galois Field elements determined from a received code word. The decoder also includes a Galois Field generator adapted to generate the Galois Fields elements in real time substantially concurrently with reception of the sequence of code words such that the Galois Field elements are generated in descending order relative to the order of reception of the sequence of code words.

BRIEF DESCRIPTION OF THE DRAWINGS

FIG. 4 depicts an exemplary right shift register adapted in accordance with features and aspects hereof to generate Galois Field values in descending order.

FIG. 5 depicts and exemplary structure for recursive computation of an erasure locator polynomial in accordance with features and aspects hereof.

FIG. 6 is a block diagram providing an exemplary system for enhanced erasure detection and correction in accordance with features and aspects hereof.

DETAILED DESCRIPTION OF THE DRAWINGS

Figure 1:
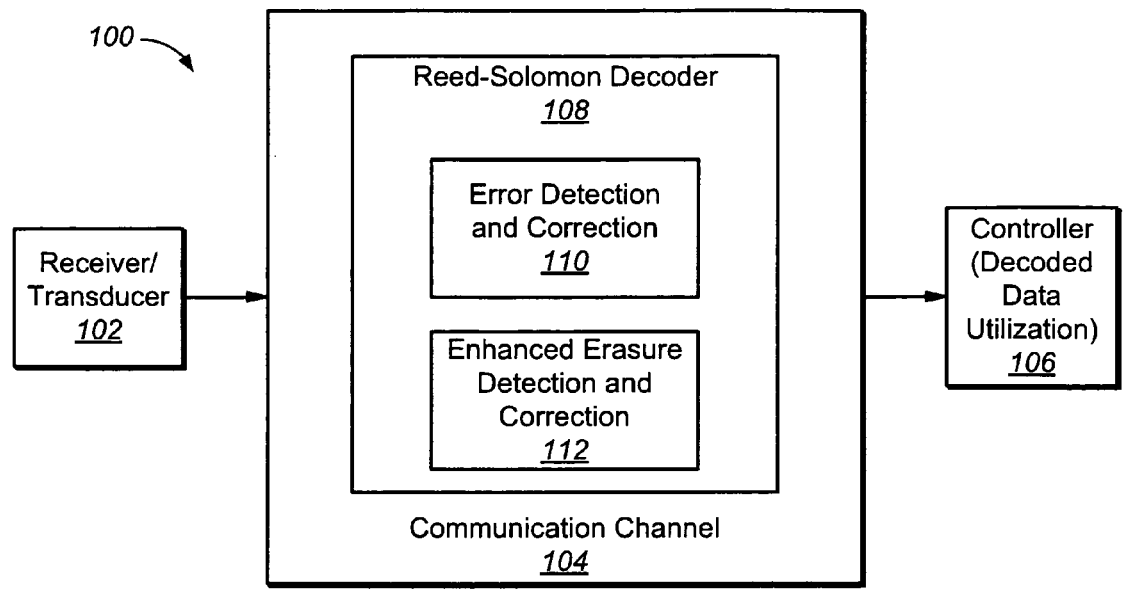
FIG. 1 is a block diagram showing an exemplary system embodying features and aspects hereof to improve erasure detection and correction in Reed-Solomon erasure detection and correction.

FIG. 1 is a block diagram showing a system 100 embodying features and aspects hereof System 100 may be any device or system in which digital, encoded data is received or retrieved to be decoded and utilized. For example, system 100 may be a receiving component adapted to receive encoded digital data from a transmitting device of a digital communication system. The transmission medium (not shown) may be electrical impulses carried over wires, radio frequency transmissions, optical modulations, etc. Or, for example, system 100 may be a component of a storage device such as a rotating magnetic or optical disk drive in which encoded digital data is stored on a recordable medium modulated as changes in the magnetic or optical properties of the recordable medium. System 100 then retrieves the previously stored, encoded, digital data. As is well known in the art, encoding of such digital data helps to reduce error rates in the received or retrieved data. In general, such digital encoding techniques encode and spread units of data to be transmitted or stored over a larger range of encoded code words in such a manner that a decoding system 100 may detect and correct errors as well as erasures in the received or retrieved data based on expected sequences of code words and disallowed sequences of code word values.

In general, system 100 may include a receiver or transducer element 102 for receiving the transmitted, encoded digital data or for sensing the modulation changes of the previously recorded, stored data. The received or retrieved sequence of bits representing encoded digital data are grouped into symbols or code words of fixed or variable length depending on the particular encoding techniques utilized. Communication channel 104 thus receives a sequence of code words representing the encoded digital data. Decoder 108 within communication channel 104 decodes the sequence of code words received by communication channel 104 and applies the decoded digital data to controller 106 for further utilization of the decoded information.

In accordance with features and aspects hereof, decoder 108 may implement Reed-Solomon techniques for decoding the encoded sequence of code words. Reed-Solomon encoding/decoding techniques are well known to those of ordinary skill in the art and are commonly applied in a variety of digital communication systems and data storage systems. Reed-Solomon encoding/decoding techniques provide for highly effective error detection and correction and for erasure detection and correction. Decoder 108 may therefore preferably be a Reed-Solomon decoder implementing Reed-Solomon decoding techniques including associated error correction and erasure correction. Decoder 108 therefore may include error detection and correction element 110 and erasure detection and correction element 112.

Error detection and correction element 110 is operable in accordance with well-known Reed-Solomon decoding techniques to allow for correction of a variety of errors detected in the received sequence of encoded code words. In general, such error detection techniques implement computation of a polynomial function of the received code words and generated Galois Field values. Galois Field values are generally utilized in the Reed-Solomon encoding/decoding as a basis for the spreading of the digital data into encoded code words and thus for detecting off a variety of errors in the received code words. For detection and correction of errors by element 110, the well-known polynomial for such error correction utilizes Galois Fields computed/generated in an order that essentially matches the order in which encoded code words are received. In other words, a first Galois Field element may be computed in association with the first received code word, the second GF value is computed with the second received code word, etc. Error detection and correction element 110 then uses the GF values computed in the same order as the received code words for correcting various bit errors in the received code words.

As noted above and as well known in the art, erasure detection and correction in association with Reed-Solomon encoded information requires utilization of a polynomial that uses Galois Field values that correspond to the reverse order of received encoded code words. In general, erasure detection and correction of Reed-Solomon encoded information presumes that the sequence of encoded code words is logically organized into fixed size blocks. The polynomial used for such erasure detection and correction therefore presumes knowledge of this predetermined block size in generating and using the GF values. In the context of storage device applications of Reed-Solomon encoding and decoding, the fixed block size may correspond to a block or sector size associated with the recordable medium of the storage device. The polynomial used for detecting and correcting erasure in a first received code word of the sequence of code words requires a Galois Field value computed by the operation of the Galois Field generator based on reception of the last code word of the sequence of code words of the fixed size block, the erasure detection and correction for the second code word uses the GF value associated with the next to last code word of the block. In other words for a block of N code words, as code words 1 . . . N are received, the GF value required for erasure detection and correction for each received code word is that which corresponds to code words N . . . 1.

One known method of erasure detection and correction in Reed-Solomon encoding is to operate a Galois Field generator circuit in such a manner as to generate all possible GF values useful for the block of encoded code words. The pre-computed GF values are stored in a table structure or register file for subsequent access by the erasure locator polynomial computation structures. Thus, in a sequence of code words representing a block of N units of data, in response to receipt of the first code word of a block, the erasure detection and correction polynomial computation structure may access the GF values from the table or register file corresponding to the $N^{th}$ entry. More generally, such known table structures or register files may access a pre-computed GF values at table entry index N-i (where i=1 . . . N) the index of the received code word in the sequence of code words.

As noted above currently practiced techniques utilizing a table structure or register file for storing pre-computed Galois Field values is costly and complex. The size of such a table may represent a significant cost and complexity in computational circuits used for the Reed-Solomon decoding components of system 100. For example, a common application of Reed-Solomon encoding/decoding techniques generates a 10-bit code word to represent each 8-bit byte of un-encoded digital data. Such a ten bit code word requires $2^{10}$ GF values for polynomial computation for erasure detection and correction. Thus, a table or register file structure used to store pre-computed Galois Field values would require 1024 entries of 10 bits each. Storage device applications of Reed-Solomon encoding/decoding techniques are starting to use larger and larger block sizes. In addition, the size of the code word used for encoding bytes of data is also increasing to further spread the encoding of the data and thus permit better error correction. Thus a table structure or register file would require still more storage space for retaining the pre-computed GF values for larger blocks and for larger code words. In addition, performance of such a table structure or register file is critical to performance of the Reed-Solomon decoder 108. The table structure or register file cannot utilize slower speed, lower cost, memory structures or the required performance for high speed reception or retrieval cannot be attained. Thus, the table structure or register file must utilize high speed, higher cost memory devices and/or register file structures.

Erasure detection and correction element 112 of FIG. 1 is enhanced in accordance with features and aspects hereof to provide real time computation/generation of required Galois Field values for Reed-Solomon erasure detection and correction without the need for such high speed, high cost memory devices and/or register file structures for storing pre-computed GF values. In accordance with features and aspects hereof, a Galois Field generator generates GF values as required for erasure detection and correction in real time substantially concurrent with reception of the encoded code words and associated decoding thereof. By comparison to other known GF generators as used for error detection and correction rather than erasure detection and correction, the Galois Field generator in accordance with features and aspects hereof uses a right shift register structure to compute each GF value in reverse order of the received code words. In other words, as the first code word of a sequence of code words in a block of size N is received, a Galois Field corresponding to the $N^{th}$ GF value is computed in real time substantially concurrently with reception/retrieval and decoding of the first code word. Details of an exemplary Galois Field generator in accordance with features and aspects hereof are presented further herein below.

As noted above, system 100 of FIG. 1 may be useful in the context of digital communication systems where a transmitting device (not shown) transmits an encoded sequence of code words (logically organized into fixed size blocks) for reception and decoding by system 100. Still further, as noted above, system 100 of FIG. 1 may be usefully applied in the context of a data storage device (e.g., magnetic and/or optical disk drives or other storage devices). Writing/recording features of such a storage device (not shown in FIG. 1) may encode users supplied data in accordance with Reed-Solomon encoding techniques and record the encoded data by modulating magnetic and/or optical properties of a recording medium of the storage device. Thus the system 100 including the enhanced erasure detection and correction element 112 may be advantageously applied to a wide variety of high speed digital data communications systems and high density digital data recording systems.

Those of ordinary skill in the art will readily recognize a wide variety of additional components within a fully operational system 100. In particular, a variety of digital and analog devices may be present in a receiver/transducer element 102. A variety of digital processing elements may also be required within an operational communication channel 104 to perform all other functionality of the communication channel in addition to the decoding function of element 108. Those of ordinary skill in the arts will readily recognize such additional elements as may be required for a fully operational system 100 and will further recognize that these additional components are eliminated from FIG. 1 merely for simplicity and brevity of this description.

FIG. 6 is a block diagram of another apparatus in accordance with features and aspects hereof showing the key functions of a system 600 operable in accordance with features and aspects hereof. Received message code words are received in syndrome computation element 602. Erasure locator indicators (e.g., from a signal of the communication channel) are receive at erasure polynomial calculation element 604. Error detection and correction element 606 then receives decoded syndromes from element 602 and erasure polynomial values corresponding thereto from element 604 and applies Reed-Solomon decoding and error correction to the received syndromes. Erasure polynomial calculation element 604 is enhanced in accordance with features and aspects hereof to generate requisite Galois Field values in descending order as discussed above to obviate the need of prior solutions for large, high performance lookup table structures to retrieve pre-determined Galois Field values.

Figure 2:
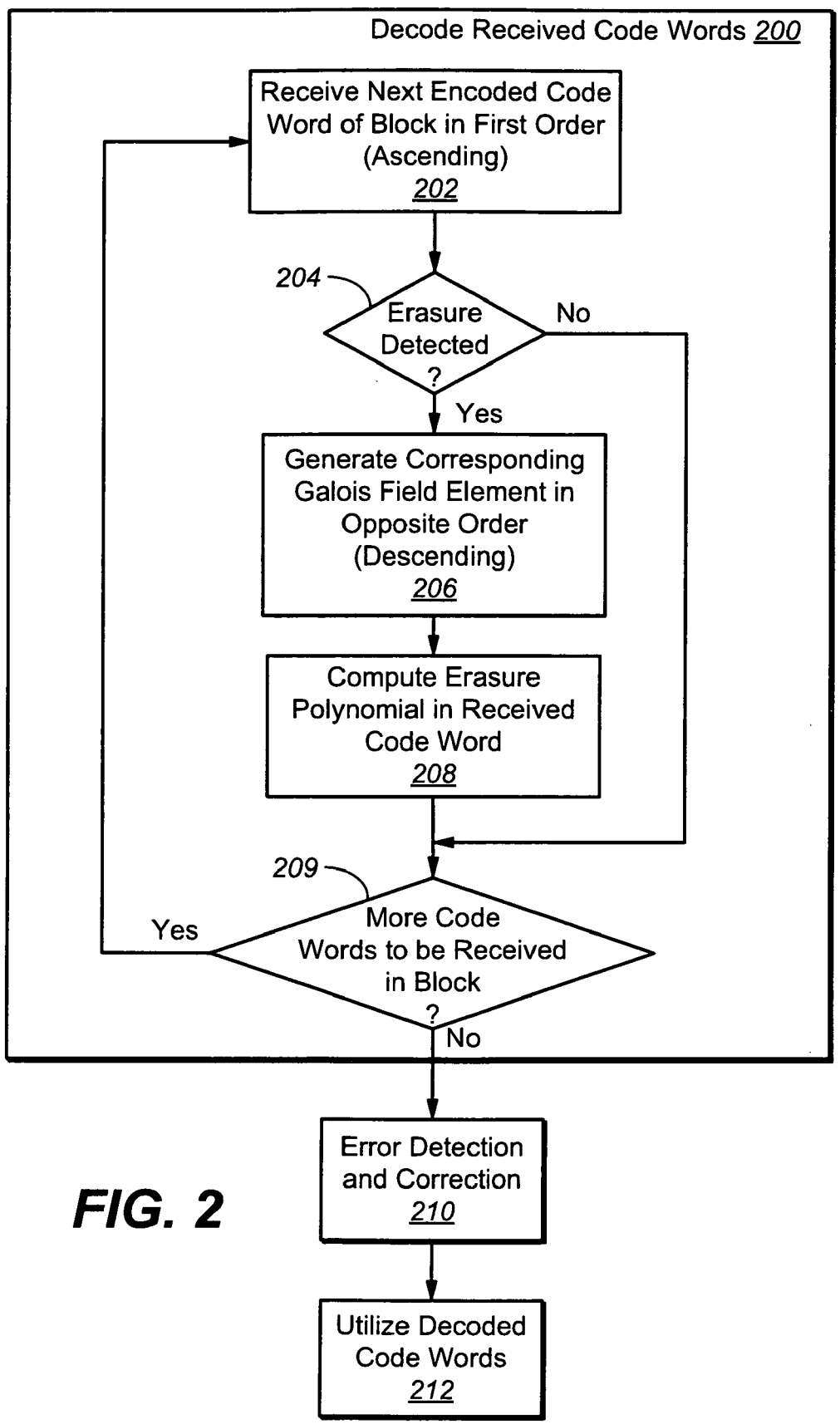
FIG. 2 is a flowchart describing exemplary operation of a system such as that of FIG. 1 in accordance with features and aspects hereof to improve Reed-Solomon erasure detection and correction.

FIG. 2 is a flowchart broadly describing operation of a system such as system 100 of FIG. 1 in accordance with features and aspects hereof. Element 200 represents processing associated with the receipt of each code word. As noted, code words are received in a first order or sequence and logically organized in fixed size blocks of N code words. The received code words may be encoded, for example, in accordance with known Reed-Solomon encoding techniques including a variety of modified versions of Reed-Solomon encoding that provide for enhanced error detection and correction as well as enhanced erasure detection and correction.

For each received code word, elements 202 through 209 are next operable until element 209 determines that the entire block of N code words has been received. Specifically, element 202 is operable to receive the next encoded code word. Element 204 is operable to detect whether a flag associated with the received code word indicates that the received code word is possibly invalid due to an erasure condition. If the received code word appears valid (not erased), element 209 then determines if this was the last code word expected in the block and loops back to element 202 to await receipt of the next code word. If element 204 determines that the next received code word is likely invalid due to a possible erasure, element 206 is next operable to generate a corresponding Galois Field value for use in computation of the erasure locating and correction polynomial. As noted above, features and aspects hereof permit real time computation of the Galois Field value required for this received code word by computing the GF values in the opposite or descending order as compared to the order in which code words are received. Thus, features and aspects hereof permit real time computation of the GF value without the need for high speed, high cost memory structures or register file structures for storing a large number of pre-computed GF values.

Utilizing the Galois Field value computed by element 206, element 208 is next operable to compute the erasure polynomial for the particular erasure in the newly received code word. After receiving the block of code words, element 209 is again operable to determine if more code words are expected in the block of code words. If so, processing loops back to element 202 to await a next code word.

When all code words of the block have been received and the erasure locator polynomials have been computed for each possibly erased code word (using the generated GF values), element 210 is then operable to perform standard error detection and correction of the received block of code words. Element 212 is lastly operable to utilize the decoded, corrected data value as appropriate for the particular system application. Those of ordinary skill in the art will readily recognize other detailed processing steps and elements useful within. Normal Reed-Solomon decoding techniques and normal Reed-Solomon error detecting and correcting techniques are applied within element 210 after the syndromes and erasure polynomial computation of the block of received code words. Such Reed-Solomon processing and error detection and correction techniques and structures are well known to those of ordinary skill in the art and well documented in the prior art.

Figure 3:
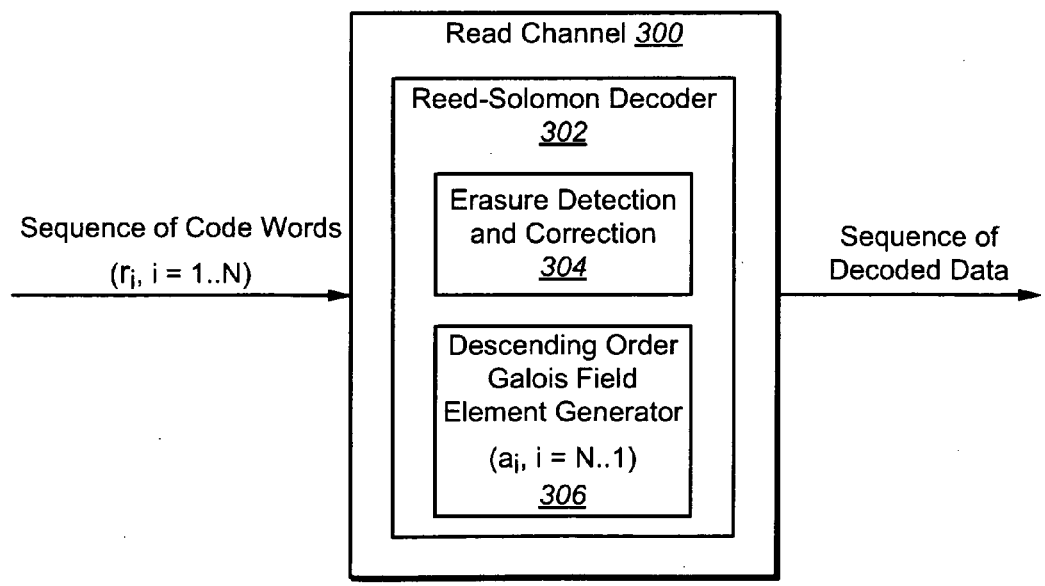
FIG. 3 depicts an exemplary communication channel operable in accordance with features and aspects hereof to provide enhanced erasure detection and correction for Reed-Solomon encoded information.

FIG. 3 depicts an exemplary communication channel 300 operable in accordance with features and aspects hereof to provide enhanced at the erasure detection and correction. Communication channel 300 receives a sequence of encoded code words $r_i$, i=1 ... N where N is the size of the logical block of code words. Received code words are decoded and corrected in accordance with Reed-Solomon encoding/decoding techniques. Thus, communication channel 300 includes, among other elements, Reed-Solomon decoder element 302 operable to decode each received code word. Techniques and structures for normal decoding of each received code word are well known to those of ordinary skill in the art. Such standard techniques include correction of errors other than erasure errors as well as prior known techniques for correcting erasures detected in received code words. As noted above, prior erasure detection and correction techniques required high speed, high cost memory devices and/or register file circuit structures to store a potentially large number of pre-computed Galois Field values for use in erasure detection and correction. In accordance with features and aspects hereof erasure detection and correction element 304 is co-operable with descending order Galois Field generator 306. Erasure detection and correction element 304 utilizes a well known polynomial for computing for detecting a likely erasure in a received code word and for correcting same when detected. The following polynomial is well known in Reed-Solomon decoding as useful for an erasure locator polynomial.

$$\Gamma(x) = \prod_{j=0}^{\rho} (1 - x\alpha^{j_n})$$

where: $\rho$ is the number of erasures inside the received n code words, and $\alpha^{j_n}$ is the Galois Field element associated with the erased code word j inside the receiving n code words. The above well-known polynomial expression can also be expressed in a recursive computation as follows:

$$\Gamma^{(i)}(x) = \Gamma^{(i-1)}(x)(1-\alpha^{n-i}x)$$

which may be simplified to:

$$\Gamma_j^{(i)} = \Gamma_j^{(i-1)} - \Gamma_{j-1}^{(i-1)} \alpha^{n-i}$$

where (i) is the cycle time. For example, $\Gamma_j^{(i)}$ represents the value of register j in FIG. 5 noted below at (i) moment; $\Gamma_j^{(i-1)}$ represents the value of register j at time (i−1), and $\alpha^{n-i}$ is the Galois Field GF($2^m$) element associated with the received symbol $r_i$. Where i=1 ... n.

FIG. 5 is a diagram of the discrete time computation logic associated with the recursive expression of the erasure locator polynomial. Erasure_flg_en is a signal generated external to the Reed-Solomon decoder (e.g., from the receiver/transducer or other elements of the communication channel device circuit) indicating that the current code word "i" in the sequence of code words i=1 ... n is likely invalid due to an erasure. The upper portion of FIG. 5 graphically depicts the simplified recursive equation above and can be described as: register j at time i equals its previous value at time i−1 minus the value in register j−1 at time i−1 multiplied by the Galois Field element $\alpha^{n-i}$. The lower portion of FIG. 5 calculates $\Gamma(x)$. For example, when there is no erasure in n code words, only $\Gamma_0$ is "1", all other $\Gamma$ registers have "0" values. When one erasure is sensed, $\Gamma_0$ is still "1", $\Gamma_1$ will calculated by the above recursive equations. In the case of two erasures, $\Gamma_0$ is "1", $\Gamma_1$ and $\Gamma_2$ are calculated as in the above recursive equations, and so on. FIG. 5 therefore represents the erasure polynomial register values when ρ erasures are sensed in n code words.

As can be seen in the above recursive equations and FIG. 5, computation of the erasure locator polynomial requires a Galois Field value generated in the reverse or descending order relative to the order in which symbols are received (e.g., generating GF values for indices n . . . 1 as code words are received in the sequence 1 . . . n). The descending order of generation of Galois Field values by element 306 may be implemented by an m-stage right shift register with pre-defined taps for the field generator m(x). For example in the case of a 10-bit Reed-Solomon code word, $m(x)=x^{10}+x^3+1$ expresses the operation of the descending Galois Field generator $GF(2^{10})$. FIG. 4 graphically depicts such an m-stage right shift register 400 with a predefined tap 402. Initialization of such a descending $GF(2^{10})$ field generator may be performed as: $\alpha^{(0)}=\alpha^{n-1}$, where n is the receiving symbol degree.

Logic circuits to implement the components shown by FIGS. 4 and 5 will be readily apparent to those of ordinary skill in the art through use of simple register and shift register structures, summing junctions, and product junctions. Standard discrete, combinatorial logic elements may be used to implement such a structure as well as custom designed integrated circuit structures. A variety of equivalent circuit structures will be readily apparent to those of ordinary skill in the art further. Further, ubiquitous bit clock signals (not shown in FIGS. 4 and 5) are applied in accordance with the particular application data rate as transmitted code words are received and/or sensed by an appropriate transducer. Clocking signals associated with logic of FIGS. 4 and 5 will be readily apparent to those of ordinary skill in the art.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. In particular, those of ordinary skill in the art will readily recognize that features and aspects hereof may be implemented equivalently in electronic circuits or as suitably programmed instructions of a general or special purpose processor. Such equivalency of circuit and programming designs is well known to those skilled in the art as a matter of design choice. As a result, the invention is not limited to the specific examples and illustrations discussed above, but only by the following claims and their equivalents.

What is claimed is:

1. In a digital communication system comprising a read channel, a method of processing received data in a digital communication channel, the method comprising:

receiving a sequence of code words representing encoded digital data;

decoding the encoded digital data to generate decoded digital data to be utilized in further data processing, wherein the step of decoding further comprises:

correcting erasures in the sequence of code words by applying a discrete time polynomial thereto wherein the discrete time polynomial utilizes Galois Field elements determined from the sequence code words; and generating the Galois Field elements in real time substantially concurrently with reception of the sequence of code words wherein the Galois Field elements are generated in descending order relative to the order of reception of the sequence of code words, wherein the steps of receiving, decoding, correcting, and generating are all performed by the digital communication channel.

2. The method of claim 1
wherein the step of decoding further comprises applying the sequence of code words to a Reed-Solomon decoder.

3. The method of claim 2
wherein the step of correcting further comprises applying the sequence of code words to an erasure locator polynomial in accordance with the Reed-Solomon decoder.

4. The method of claim 3
wherein the erasure locator polynomial is:

$$\Gamma(x) = \prod_{j=0}^{\rho} (1 - x\alpha^{jn})$$

where: $\alpha^{jn}$ is the Galois Field element associated with the erased code word j inside the receiving n code words, ρ is the number of erasure flags received.

5. The method of claim 1
wherein the step of generating the Galois Field elements further comprises operating a Galois Field generator circuit comprising a right shift register with a feedback connection operable in accordance with a pre-defined tap.

6. The method of claim 5 wherein each code words is 10 bits and wherein the right shift register is a 10-bit register operable in accordance with the pre-defined tap defined by the discrete time polynomial $m(x)=x^{10}+x^3+1$ where x is a 10 bit code word.

7. The method of claim 1
wherein the step of receiving further comprises receiving the sequence of code words from a read head transducer of a storage device.

8. The method of claim 1
wherein the step of receiving further comprises receiving the sequence of code words from a receiver of a communication device.

9. A read channel comprising:

a receiver for receiving a sequence of words representing encoded digital data; and a decoder coupled to receive a sequence of code words representing encoded digital data, the decoder adapted to generate corresponding decoded digital data wherein the decoder further comprises:

an erasure correction element adapted to detect and correct erasures in the received sequence of code words by applying a discrete time polynomial to the sequence of code words wherein the discrete time polynomial utilizes Galois Field elements determined from a received code word; and a Galois Field generator adapted to generate the Galois Fields elements in real time substantially concurrently with reception of the sequence of code words wherein the Galois Field elements are generated in descending order relative to the order of reception of the sequence of code words.

10. The read channel of claim 9 wherein the decoder is a Reed-Solomon decoder.

11. The read channel of claim 10 wherein the erasure correction element is operable in accordance with the erasure locator polynomial:

$$\Gamma(x) = \prod_{j=0}^{\rho}(1 - x\alpha^{jn})$$

where: $\alpha^{jn}$ is the Galois Field element associated with the erased code word j inside the receiving n code word, $\rho$ is the number of erasure flags received.

12. The read channel of claim 9 wherein the Galois Field generator further comprises a right shift register with a feedback connection operable in accordance with a pre-defined tap.

13. The read channel of claim 12 wherein each code words is 10 bits and wherein the right shift register is a 10-bit register operable in accordance with the pre-defined tap defined by the discrete time polynomial $m(x)=x^{10}+x^3+1$ where x is a 10 bit code word.

14. The read channel of claim 9 wherein the read channel is adapted to receive the sequence of code words from a read head transducer of a storage device.

15. The read channel of claim 9 wherein the read channel is adapted to receive the sequence of code words from a receiver of a communication device.

16. A data storage device comprising:
a recordable medium;
a read head transducer associated with the recordable medium for reading encoded digital data as a sequence of code words previously recorded on the recordable medium;
a read channel coupled to the read head transducer to receive the sequence of code words and adapted to decode the sequence of code words to generate decoded data; and
a controller coupled to the read channel and adapted to receive the decoded data and further adapted to process the received decoded data,
wherein the read channel further comprises:
a Reed-Solomon decoder for decoding the sequence of code words,
wherein the Reed-Solomon decoder further comprises:
an erasure correction circuit for correcting errors detected in the sequence of code words as caused by erasure of one or more code words,
wherein the erasure correction circuit further comprises:
a Galois Field generator for generating a sequence of Galois Field elements each element corresponding with a code word of the sequence of code words, wherein the Galois Field generator is operable substantially concurrently with the reception of the sequence of code words, and wherein the Galois Field generator is further adapted to generate the Galois Field elements in descending order relative to the ascending order of the received sequence of code words.

17. The data storage device of claim 16 wherein the erasure correction circuit is operable in accordance with the erasure locator polynomial:

$$\Gamma(x) = \prod_{j=0}^{\rho}(1 - x\alpha^{jn})$$

where: $\alpha^{jn}$ is the Galois Field element associated with the erased code word j inside the receiving n code words, $\rho$ is the number of erasure flags received.

18. The data storage device of claim 16 wherein the Galois Field generator further comprises a right shift register with a feedback connection operable in accordance with a pre-defined tap.

19. The data storage device of claim 18 wherein each code words is 10 bits and wherein the right shift register is a 10-bit register operable in accordance with the pre-defined tap defined by the discrete time polynomial $m(x)=x^{10}+x^3+1$ where x is a 10 bit code word.

* * * * *